United States Patent
Ogino et al.

(10) Patent No.: US 6,423,571 B2
(45) Date of Patent: Jul. 23, 2002

(54) METHOD OF MAKING A SEMICONDUCTOR DEVICE HAVING A STRESS RELIEVING MECHANISM

(75) Inventors: Masahiko Ogino; Akira Nagai, both of Hitachi; Shuji Eguchi, Tokai-mura; Toshiaki Ishii, Hitachi; Masanori Segawa, Hitachi; Haruo Akahoshi, Hitachi; Akio Takahashi, Hitachiohta; Takao Miwa, Hitachinaka; Naotaka Tanaka, Chiyoda-machi; Ichirou Anjou, Koganei, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/884,378

(22) Filed: Jun. 20, 2001

Related U.S. Application Data

(62) Division of application No. 09/482,891, filed on Jan. 14, 2000, which is a division of application No. 08/809,233, filed as application No. PCT/JP95/00714 on Apr. 12, 1995, now Pat. No. 6,028,364.

(30) Foreign Application Priority Data

Sep. 20, 1994 (JP) .............................. 6-224674

(51) Int. Cl.⁷ .................. H01L 21/44; H01L 21/48; H01L 21/50
(52) U.S. Cl. ...................................... 438/106; 438/121
(58) Field of Search .................................. 438/106, 121

(56) References Cited

U.S. PATENT DOCUMENTS

| | | | |
|---|---|---|---|
| 4,744,007 A | 5/1988 | Watari et al. ............... 361/386 |
| 4,825,284 A | 4/1989 | Soga et al. ................. 257/778 |
| 4,948,754 A | 8/1990 | Kondo et al. ............... 438/613 |
| 5,097,318 A | 3/1992 | Tanaka et al. .............. 257/690 |
| 5,220,199 A | 6/1993 | Owada et al. .............. 257/737 |
| 5,281,151 A | 1/1994 | Arima et al. ............... 257/778 |
| 5,291,064 A | 3/1994 | Kurokawa .................. 257/114 |
| 5,322,593 A | 6/1994 | Hasegawa et al. ......... 156/633 |
| 5,350,886 A | 9/1994 | Miyazaki et al. .......... 174/255 |
| RE34,887 E | 3/1995 | Ushifusa et al. ........... 361/795 |
| 5,550,408 A | 8/1996 | Kunitomo et al. ......... 257/737 |
| 5,565,706 A | 10/1996 | Miura et al. ................ 257/723 |
| 5,615,089 A | 3/1997 | Yoneda et al. ............. 361/764 |
| 5,635,767 A | 6/1997 | Wenzel et al. ............. 257/778 |
| 5,861,664 A | 1/1999 | Inoue ........................ 257/700 |
| 6,022,758 A * | 2/2000 | Badehi |
| 6,232,131 B1 * | 5/2001 | Nagano et al. |

FOREIGN PATENT DOCUMENTS

| JP | 3-116838 | 5/1991 |
|---|---|---|

* cited by examiner

Primary Examiner—John F. Niebling
Assistant Examiner—Josetta I. Jones
(74) Attorney, Agent, or Firm—Antonelli, Terry, Stout & Kraus, LLP

(57) ABSTRACT

A method of forming a semiconductor device having a multi-layered wiring structure that includes a conductor layer to be electrically connected to a packaging substrate, with the multi-layered wiring structure being provided on a circuit formation surface of a semiconductor chip. Ball-like terminals are formed, disposed in a grid array on the surface of the multi-layered wiring structure on the packaging substrate side. The multi-layered wiring structure is formed to include a buffer layer for relieving a thermal stress provided between the semiconductor chip and the packaging substrate, due to the packaging procedure. In the semiconductor device formed, the wiring distance is shorter than that of a conventional semiconductor device, so that an inductance component becomes smaller, to thereby increase signal speed. The distance between a ground layer and a power supply layer is shortened, to reduce noise produced upon operation, and also a thermal stress upon packaging is relieved by the buffer layer of the multi-layered wiring structure, resulting in improved connection reliability, and the number of terminals per unit can be increased, because of elimination of wire bonding. The buffer layer can be made of an elastomer, and can have a modulus of elasticity of 10 kg/mm² or less.

19 Claims, 6 Drawing Sheets

METHOD OF MAKING A SEMICONDUCTOR DEVICE HAVING A STRESS RELIEVING MECHANISM

This application is a Divisional application of application Ser. No. 09/482,891, filed Jan. 14, 2000, which is a Divisional application of application Ser. No. 08/809,233, filed Mar. 19, 1997 now U.S. Pat. No. 6,028,364, which is an application filed under 35 USC 371 of International application Ser. No. PCT/JP95/00714, filed Apr. 12, 1995.

TECHNICAL FIELD

The present invention relates to a semiconductor device used for high density packaging, multi-chip module, bare chip packaging, and the like, and a packaging structure of the semiconductor device.

BACKGROUND ART

In recent years, the reduced sizes and increased performances of the electronic devices will generate the demand for higher integration, higher density, and higher processing speed of semiconductor devices used for the electronic devices. To meet such a demand, packages of semiconductor devices are being developed from a pin insertion type to a surface packaging type for increasing the packaging densities, and also developed from a DIP (Dual Inline Package) type to a QFP (Quad Flat Package) type and a PGA (Pin Grid Array) type for coping with the multi-pin arrangement.

Of the packages thus developed, the QFP is difficult to cope with the multi-pin arrangement because it is so configured that leads to be connected to a packaging substrate are concentrated only at a peripheral portion of the package and are also liable to be deformed due to finer diameters thereof. Besides, the PGA has a limitation in coping with both high speed processing and surface packaging because it is so configured that terminals to be connected to a packaging substrate are elongated and very collectively arranged.

Recently, to solve these problems and to realize a semiconductor device capable of coping with high speed processing, a BGA (Ball Grid Array) package is disclosed in U.S. Pat. No. 5,148,265, which has ball-like connection terminals over the entire packaging surface of a carrier substrate electrically connected to a semiconductor chip by gold wire bonding. In this package, since the terminals to be connected to a packaging substrate are formed into ball-like shapes, they can be arranged in a dispersed manner over the entire packaging surface without such deformation of leads as found in the QFP, so that pitches between the terminals become larger, to thereby make surface packaging easy; and also since the lengths of the connection terminals are shorter than those of the PGA, an inductance component becomes smaller and thereby a signal transmission speed becomes faster, with a result that such a package is allowed to cope with high speed processing.

In the above-described BGA package, an elastic body is inserted as an interposer between a semiconductor chip and terminals of a packaging substrate for relieving a thermal stress produced due to a difference in thermal expansion between the packaging substrate and the semiconductor chip upon packaging thereof. The semiconductor device having such a structure, however, has problems depending on the use of gold wire bonding for connection with upper electrodes of the semiconductor chip; namely, since the connection portions connected to the gold wires are concentrated only at a peripheral portion of the chip, the structure has a spontaneous limitation in coping with the further increasing futuristic demand for multi-pin arrangement and higher processing speed of semiconductor devices and has also an inconvenience in terms of mass-production and improvement in production yield because of the increased number of production steps due to the complexity thereof.

Japanese Patent Laid-open No. Hei 5-326625 discloses an improved packaging structure of a flip-chip type package in which a LSI chip having solder bumps is mounted on a multi-layered wiring ceramic substrate having solder bumps, wherein a sealing member is filled between the LSI chip and the multi-layered wiring ceramic substrate as a carrier substrate. The above packaging structure, however, seems to have a problem in terms of higher density interconnection, higher response speed of signals, and miniaturization of the package, because the use of the ceramic substrate as multiple wiring layers makes it difficult to reduce a dielectric constant. Another problem of such a package resides in the production step requiring high temperature burning for ceramic, and in difficult handling of the brittle, thin ceramic substrate.

Objects of the present invention are to provide a semiconductor device capable of coping with the further increasing futuristic demand for high speed processing and high density packaging and being high in reliability in connection with a packaging substrate; and to provide a packaging structure of the semiconductor device.

DISCLOSURE OF THE INVENTION

The gist of the present invention made for solving the above-described problems is as follows:

(1) According to the present invention, there is provided a semiconductor device including: a multi-layered wiring structure having a conductive layer to be electrically connected to a packaging substrate, the structure being provided on the surface of a semiconductor chip on the packaging substrate side; and ball-like terminals disposed in a grid array on the surface of the multi-layered wiring structure on the packaging substrate side, wherein the multi-layered wiring structure includes a buffer layer for relieving a thermal stress produced between the semiconductor chip and the packaging substrate after packaging thereof, and multiple wiring layers.

(2) According to the present invention, there is also provided a semiconductor device including: a multi-layered wiring structure having a conductive layer to be electrically connected to a packaging substrate, the structure being provided on the surface of a semiconductor chip on the packaging substrate side; and ball-like terminals disposed in a grid array on the surface of the multi-layered wiring structure on the packaging substrate side, wherein an interlayer insulating film in multiple wiring layers for transmitting an electric signal of the multi-layered wiring structure is made of a material for reliving a thermal stress produced between the semiconductor chip and the packaging substrate after packaging thereof.

(3) According to the present invention, there is also provided a packaging structure connected to and mounted on the packaging substrate via the ball-like terminals disposed in a grid array.

The above-described multi-layered wiring structure is required to attain two purposes: to achieve electric connection between the semiconductor device and a packaging substrate when the semiconductor device is mounted on the packaging substrate; and to relieve a thermal stress produced between the semiconductor device and the packaging substrate upon packaging thereof. Accordingly, the features of the present invention reside in that ①  the above multi-layered wiring structure includes two components, that is, multiple wiring layers for transmitting an electric signal and a buffer layer for relieving a thermal stress; or ②  an interlayer insulating film in multiple wiring layers for transmitting an electric signal of the multi-layered wiring structure is made of a material for reliving a thermal stress produced between a semiconductor chip and a packaging substrate after packaging thereof, whereby serving as the function of the buffer layer.

The above multi-layered wiring structure is preferably composed of three or more layers including a conductive layer portion having a ground layer, power supply layer, and wiring layer. This makes it possible to increase a signal transmission speed and to reduce the occurrence of noise.

Each of the buffer layer and the insulating layer is preferably made of a material having a low dielectric constant. FIG. 1 shows a relationship between the dielectric constant and each of the thickness of the insulating layer and the transmission delay time. In addition, the film thickness h of the insulating layer is given by the following equation [1]. For example, for the wiring having a width w=50 µm and a height t=30 µm, the film thickness h at a characteristic impedance $Z_0$=55 Ω can be calculated by substituting these values in the equation [1].

The delay time Td can be given by substituting a dielectric constant $\epsilon_r$ of the insulating layer in the following equation (2).

$$Z_o = \frac{60}{\sqrt{\epsilon_r}} \ln\left(\frac{1.9h}{w(0.8 + t/w)}\right) \quad (1)$$

$$Td = 3.34 \sqrt{\epsilon_r} \quad [2]$$

From the result shown in FIG. 1, it becomes apparent that the use of a low dielectric constant material enables thinning of the film thickness h of the insulating layer (that is, thinning of the semiconductor device) and also enables shortening of the delay time (that is, increase in response speed). For example, in the case where the insulating layer is made of alumina which is a typical material of a ceramic substrate, since alumina has a dielectric constant of 9.34, the film thickness h of the insulating layer becomes 606 µm. On the contrary, in the case where the insulating layer is made of polyimide having a dielectric constant of 3.0, the film thickness thereof can be reduced to 180 µm. With respect to the delay time Td of the insulating layer made of polyimide, it can be shortened by about one-half of that of the insulating layer made of alumina, that is, from 10.2 ns/m to 5.78 ns/m.

The above insulating layer is preferably made of a low thermal expansion polyimide having a linear expansion coefficient of 20 ppm/K or less or a silicon elastomer having an elastic modulus of 10 kg/mm² or less. The use of these materials enables high speed transmission of an electric signal, thinning of the package, and reduction in stress of the package.

Specific examples of the above low thermal expansion polyimide may include a polyimide obtained by polymerization of pyromellitic acid dianhydride and any one of 2,5-diaminotoluene, diaminodurene, benzidine, 3,3'-dimethylbenzidine, 3,3 '-dimethoxybenzidine, 4,4'-diaminoterphenyl, 1,5-diaminonaphthalene, and 2,7-diaminofluorene; a polyimide obtained by polymerization of 3,3', 4,4'-benzophenonetetracarboxylic acid dianhydride and any one of 3,3'-dimethylbenzidine, 4,4'-diaminoterphenyl, and 2,7-diaminofluorene; a polyimide obtained by polymerization of 3,3', 4,4'-biphenyltetracarboxylic acid dianhydride and any one of paraphenylenediamine, 2,5-diaminotoluene, benzidine, 3,3'-dimethylbenzidine, 4,4'-diaminoterphenyl, 1,5-diaminonaphthalene, 2,7-diaminofluorene, and 2,5-diaminopyridine.

The present inventors have made the analysis of a thermal stress of a semiconductor device upon packaging thereof, and found that an elastic body having an elastic modulus of 10 kg/mm² or less enables the relief of the thermal stress of the semiconductor device without any influence of the linear expansion coefficient of the elastic body. Accordingly, the object of the present invention can be attained by the use of an elastic body having an elastic modulus of 10 kg/mm². When the elastic modulus of the above elastomer is more than 10 kg/mm², the elastic body is affected by the linear expansion coefficient thereof, thereby reducing the stress reliving effect of the elastomer.

The elastic body having an elastic modulus of 10 kg/mm² is preferably made of an elastomer or a low elastic engineering plastic.

Specific examples of the above elastomer may include fluorine rubber, silicon fluoride rubber, acrylic rubber, hydrogenated nitrilo rubber, ethylene propylene rubber, chlorosulfonated polystyrene rubber, epichlorohydrin rubber, butyl rubber, and urethane rubber.

Specific examples of the above low elastic engineering plastic may include polycarbonate (PC)/acrylonitrile butadiene styrene (ABS) alloy, polysiloxanedimethylterephthalate (PCT)/polyethyleneterephthalate (PET), copolymerized polybuthylene terephthalate) (PBT)/polycarbonate (PC) alloy, polytertafluoroethylene (PTFE), florinated ethylene propylene polymer (FET), polyalylate, polyamide (PA)/acrylonitrile butadiene styrene (ABS) alloy, modified epoxy resin, and modified polyolefin resin.

Other than the above plastics, there may be used a high molecular material selected from one or two or more kinds of thermosetting resins such as epoxy resin, unsaturated polyester resin, epoxyisocyanate resin, maleimide resin, maleimide epoxy resin, cyanic acid ester resin, cyanic acid ester epoxy resin, cyanic acid ester maleimide resin, phenol resin, diallyl phthalate resin, urethane resin, cyanamide resin, and maleimide cyanamide resin. Of these high molecular materials, to attain the object of the present invention, there may be preferably used those having such stable hardening characteristics as not to be hardened at room temperature but to be hardened by heating at a temperature of from 150 to 350° C. for a period of from several minutes to several hours. Such a thermosetting resin is less in thermal deformation at a high temperature and is excellent in heat resistance.

The hardened material thus obtained is desired to have a dielectric strength of 10,000 V/cm or more, and to have a heat resistance withstanding a temperature of 150° C. or more for a long period of time.

The above high molecular material before being hardened is preferably adjustable in its viscosity by a solvent, and more preferably, it exhibits such a photosensitive property as to be hardened by light emission or the like.

The multiple wiring layers of the present invention can be typically realized in accordance with either of two processes shown in FIGS. 2 and 3.

In the sequentially laminating process shown in FIG. 2, the semiconductor of the present invention can be fabricated in accordance with the following steps: first, forming a wiring layer by (a) forming an elastomer insulating layer 2 on a semiconductor chip 1, (b) forming windows 3 for interlayer connection in the insulating layer 2, and (c) forming a wiring layer by performing interlayer connection 4; secondarily, repeating the above steps by the number required for forming necessary layers, to form multiple wiring layers; and finally, (d) forming solder balls 5 as connection terminals to a packaging substrate on the multiple wiring layers.

In the film lamination process shown in FIG. 3, the semiconductor device of the present invention can be fabricated by the following steps: (e) sticking wiring sheet-like pieces 6 to each other, (f) forming windows 3 for interlayer connection in the laminated sheet-like pieces 6, (g) performing interlayer connection 4, to form a multi-layered wiring sheet, (h) adhesively bonding the multi-layered wiring sheet on a semiconductor chip via a multi-sword shaped conductor containing buffer layer 7, to form a multi-layered wiring structure, and finally forming solder bumps on the multi-layered wiring structure.

The above multi-sword shaped conductor containing buffer layer is prepared, for example, by piecing a polyimide film (thickness: about 50 $\mu$m) adhesively bonded with a copper foil (thickness: about 18 $\mu$m) at specified positions by excimer laser (KrF: 248 nm, pulse energy: 40 mj/pulse, repeated frequency: 600 Hz at maximum; average output: 24 W), to form holes (diameter: 25 $\mu$m, hole pitch: 40 $\mu$m); burying the holes with a conductive material by plating such as a known chemical copper plating, followed by etching back of the copper foil; applying nonelectrolytic tin plating on both ends of the conductive material buried in the holes, or by casting (for example, potting) an elastomer into a vessel in which a large number of gold wires are erected at specified positions; and adjusting the thickness of the elastomer containing the gold wires after hardening.

The multi-sword shaped conductor containing buffer layer can be formed of an anisotropic conductive film which has electric conduction only in the vertical direction. A semiconductor chip is superposed on one side surface of the film. At this time, with respect to the film, only portions connected to electrode portions of the semiconductor chip are made electrically conductive. On the other hand, a multi-layered wiring structure having electrodes corresponding to the electrode portions of the semiconductor chip is superposed on the other side surface of the film. At this time, with respect to the film, only portions connected to the electrodes of the multi-layered wiring structure are made electrically conductive.

The multi-sword shaped conductor containing buffer layer is connected to a semiconductor chip by Au/Sn bonding, Sn/Pb bonding, or the like. More specifically, gold is vapor-deposited at electrode portions, to be bonded to each other, of both the chip and buffer layer, followed by forming tin solders thereat by nonelectrolytic tin plating, and in such a state, both the chip and buffer layer are pressed to each other and heated (240–250° C.) for several seconds (2–3 sec), to be thus bonded to each other by melting of the tin solders formed on the electrode portions. The connection of the buffer layer to the multi-layered wiring structure can be performed in the same manner as described above.

The ball-like terminals disposed in a grid array on the connection surface of the multi-layered wiring structure to a packaging substrate may be formed of a solder alloy containing tin, zinc or lead; silver; copper or gold into ball-shapes. In this case, such a ball made of the above metal may be covered with gold. By the use of such ball-like terminals, the semiconductor device can be electrically connected to a packaging substrate by melting of the ball-like terminals or by contact or vibration of the ball-like terminals without heating. Other than the above metals, the ball-like terminal may be formed of an alloy of one kind or two or more kinds selected from molybdenum, nickel, copper, platinum and titanium; or may be formed of multi-layered films having layers made of two or more kinds selected from the above metals.

The above semiconductor chip may include a linear IC, LSI, logic, memory, gate array, or the like having circuits formed on a semiconductor substrate.

In the present invention, the semiconductor device is provided with a heat spreader for assisting heat radiation produced upon operation of the semiconductor chip. The heat spreader is formed of a material excellent in thermal conductivity, for example, a metal having a high thermal conductivity, such as copper. In particular, the heat spreader is preferably configured to have a structure (see FIG. 7) in which the semiconductor chip 1 is buried and mounted. In the heat spreader having such a structure, a multi-layered wiring structure having an area larger than that of a semiconductor chip can be formed on the heat spreader. The heat spreader having this structure may include heat radiation fins provided on the portions other than the chip mounting surface for increasing the entire heat radiation surface area.

The semiconductor device of the present invention may be so configured that two or more of semiconductor chips are mounted on the single multi-layered wiring structure According to the semiconductor device of the present invention, it is possible to dispose ball-like terminals to be connected to a packaging substrate over the entire packaging surface of the multi-layered wiring structure and to eliminate the necessity of gold wire bonding. As a result, when compared with the conventional semiconductor device, the semiconductor device of the present invention is allowed to easily cope with multi-pin arrangement, and therefore, it is suitable to higher density and higher integration.

In the semiconductor device of the present invention, since a distance between the ground layer and the power supply layer in the semiconductor substrate can be shortened and also the semiconductor chip can be directly connected to the multi-layered wiring structure without formation of solder bumps, the wiring distance can be shortened as compared with the conventional semiconductor device in which the semiconductor chip and the multi-layered wiring structure are soldered to each other by electrode bumps, with a result that an inductance component can be reduced and thereby a signal transmission speed becomes faster, leading to the increased processing speed of the semiconductor device. Also, in the present invention, the use of a low dielectric constant material (polyimide, elastomer, or the like) allows the package to be thinned more than that of the conventional package using the multi-layered ceramic substrate when compared at the same signal frequency Additionally, in the present invention, the formation of the multi-layered wiring structure having a low elastic modulus on the semiconductor chip makes it possible to reduce a thermal stress produced between a packaging substrate and the semiconductor chip, and hence to improve the reliability in connection of the semiconductor chip to the packaging substrate after packaging thereof.

BEST MODE FOR CARRYING OUT THE INVENTION

Hereinafter, the present invention will be described in detail with reference to examples.

EXAMPLE 1

Figure 1:
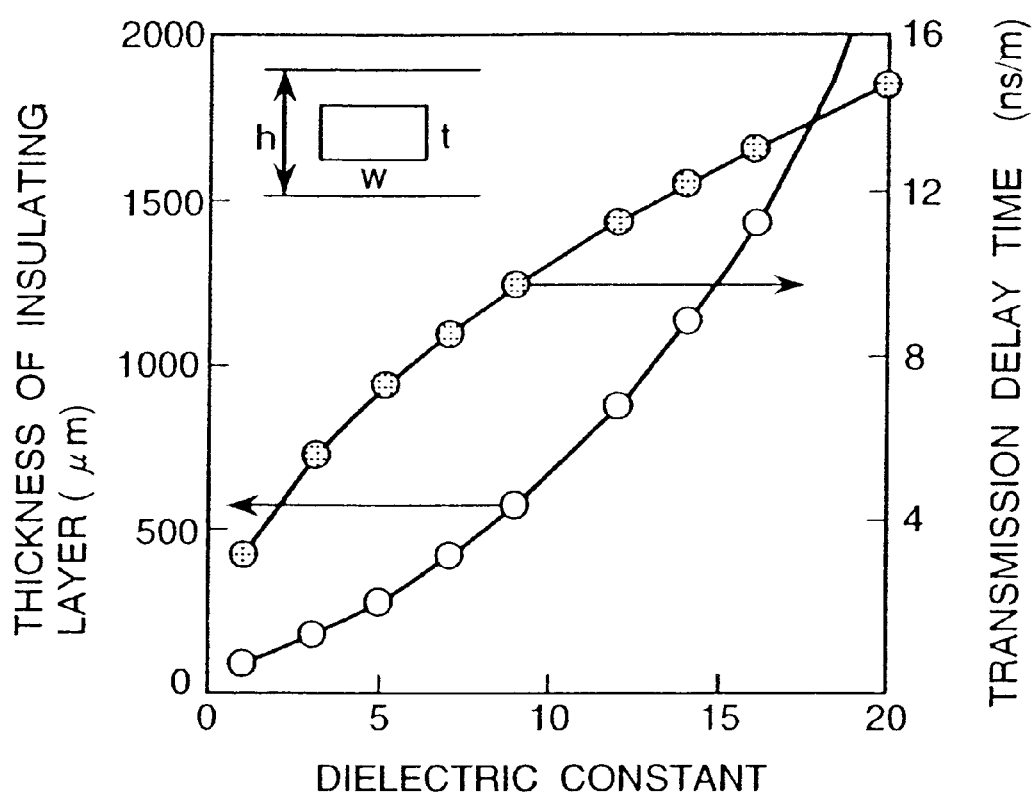
FIG. 1 is a graph showing a relationship between a dielectric constant, and each of the thickness of an insulating film and a transmission delay time.
Figure 2:
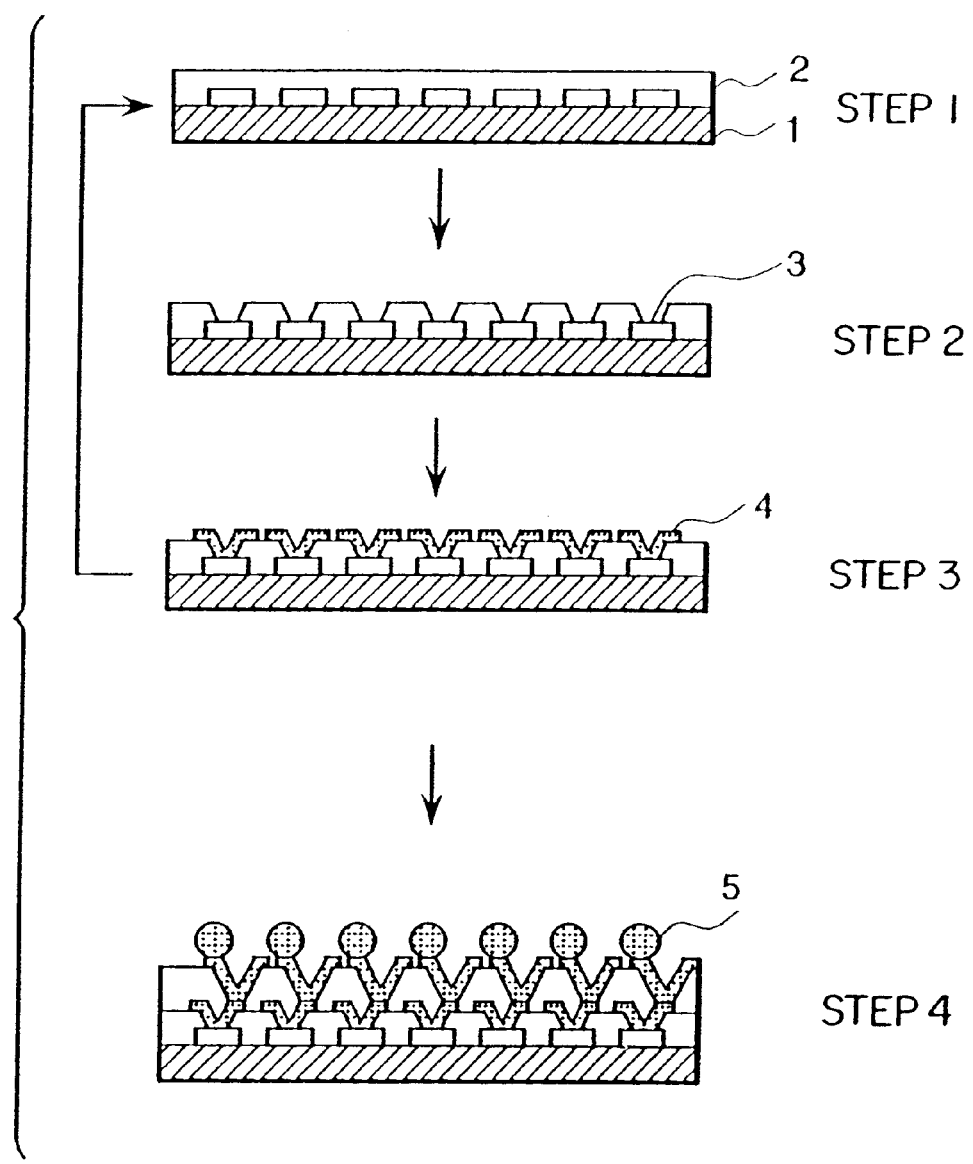
FIG. 2 is a typical view illustrating fabrication steps for realizing the present invention by a sequentially laminating process.
Figure 3:
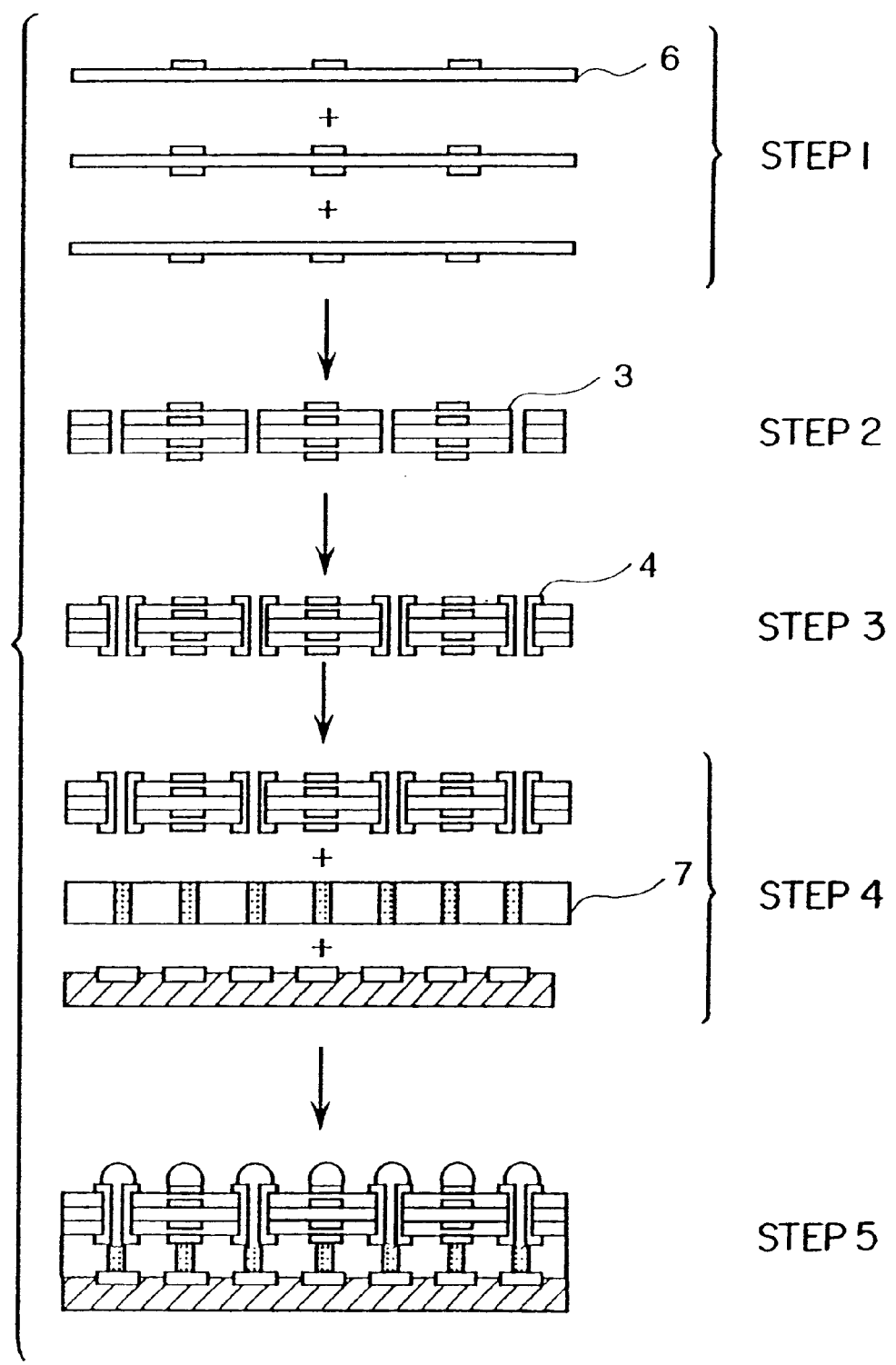
FIG. 3 is a typical view illustrating fabrication steps for realizing the present invention by a film laminating process.
Figure 4:
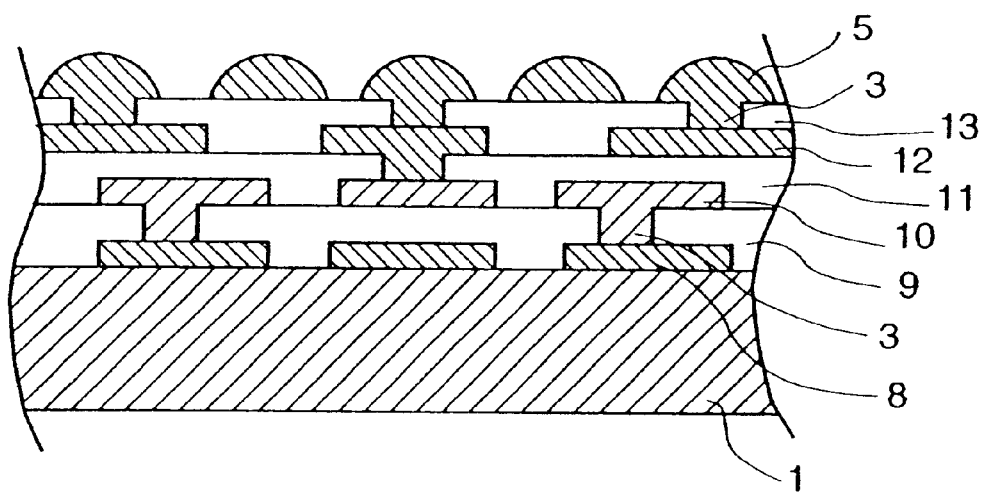
FIG. 4 is a typical sectional view of a semiconductor device according to a first example.

FIG. 4 is a typical sectional view of a semiconductor device according to one example of the present invention. A semiconductor device of the present invention was fabricated in the following procedure using a silicon semiconductor chip 1 having elements such as a transistor, diode, resistor, and the like incorporated on a semiconductor substrate.

The upper surface of the semiconductor chip 1 having a single crystal silicon wafer, a silicon layer formed on the silicon wafer by epitaxial growth, and a circuit formed in the epitaxial growth layer, was covered with a protective layer (not shown) formed of a silicon dioxide film, the protective layer being provided with windows for electric connection.

Next, a first conductive layer 8 made of aluminum was formed on the above-described semiconductor chip 1 in accordance with a specified wiring pattern by a known photoetching process. Subsequently, the substrate was spin-coated with a varnish of polyimide precursor (PIQ, produced by Hitachi Chemical Co., Ltd.) at a rotational speed of from 1,000 to 5,000 rpm, followed by heating in a nitrogen atmosphere at 100° C. for one hour and at 350° C. for 30 minutes to harden the vanish, to thereby form a first insulating film 9 formed of a polyimide film.

The polyimide film was then spin-coated with a negative type liquid resist (OMR-83, produced by TOKYO OHKA KOGYO CO., LTD), followed by hardening at 90° C. for 30 minutes. The resist film thus hardened was then subjected to photoresist patterning, followed by development, and was hardened again in a nitrogen atmosphere at 150° C. for 30 minutes, to thereby form windows in the resist film.

After that, the substrate in such a state was immersed in a mixed solution of hydrazine hydrate and ethylene diamine, to form in the polyimide film windows 3 for interlayer connection, and then the photoresist was separated from the polyimide film by a separating agent composed of an alkali solution (N303C, produced by TOKYO OHKA KOGYO CO., LTD).

After the first insulating film 9 was thus formed, a second conductive layer 10 was formed of Al by vapor-deposition, followed by patterning by the known photoetching process.

At this time, the second conductive layer 10 was electrically connected to the first conductive layer 8 through the windows 3 opened at specified positions for interlayer connection.

The above steps were repeated to form a second insulating layer 11 and a third conductive layer 12, and then an uppermost passivation film 13 was formed of a polyimide base resin (PIQ, produced by Hitachi Chemical Co., Ltd) in the same manner as described above, to thus form multiple wiring layers.

Solder balls 5 made of Sn/Pb (63/37) to be electrically connected to a package substrate were formed in a grid array over the packaging surface of the multiple wiring layers, to form a semiconductor device.

Thus, there was obtained a monolithic LSI having multiple wiring layers (a multi-layered wiring structure) formed on the semiconductor chip 1 and also having terminals, to be connected to a packaging substrate, disposed in a grid array on the uppermost surface of the multiple wiring layers.

The monolithic LSI thus obtained was evaluated in terms of temperature cycle testing [one cycle: from (−55° C./10 min) to (+150° C./10 min)], lead inductance, switching noise, and crosstalk. The results are shown in Table 1.

EXAMPLE 2

Figure 5:
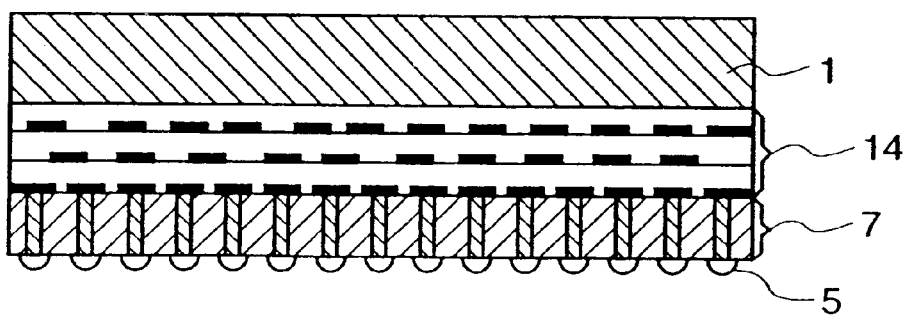
FIG. 5 is a typical sectional view of a semiconductor device according to a second example.

FIG. 5 is a typical sectional view of a semiconductor device according to one example of the present invention, wherein multiple wiring layers 14 and a buffer layer 7 are formed as a multi-layered wiring structure.

First, a copper thin film was formed by sputtering on the surface of a silicon semiconductor chip 1 having multiple wiring layers formed with a circuit and windows for electric connection. Next, the copper thin film was etched by a specified process to form a wiring. The copper thin film was then stuck with an adhesive sheet formed of a low thermal expansive polyimide film (X952, produced by Hitachi Chemical, Co., Ltd.) applied with an adhesive, followed by hardening the adhesive, and the adhesive sheet was pierced by laser to form specified holes. Via-stads were formed in the specified holes by nonelectrolytic copper plating, and then a copper film was formed on the adhesive film having the holes by sputtering.

The above steps were repeated to form multiple wiring layers 14. A buffer film (ASMAT, produced by NITTO DENKO CORPORATION) as a multi sword-shaped conductor containing buffer layer 7 was adhesively bonded via solder on the packaging surface of the multiple wiring layers by pressing and heating, and terminals composed of solder balls 5 made of Sn/Pb (63/37) were connected and formed on the packaging surface of the buffer layer 7, to thereby obtain a semiconductor device.

The semiconductor device thus obtained was evaluated in terms of temperature cycle testing, lead inductance, switching noise, and crosstalk. The results are shown in Table 1.

A semiconductor device including two semiconductor chips 1 mounted on the multiple wiring layers 14 was similarly fabricated, which gave the excellent characteristics comparable to those of the semiconductor device having the single semiconductor chip 1.

EXAMPLE 3

Figure 6:
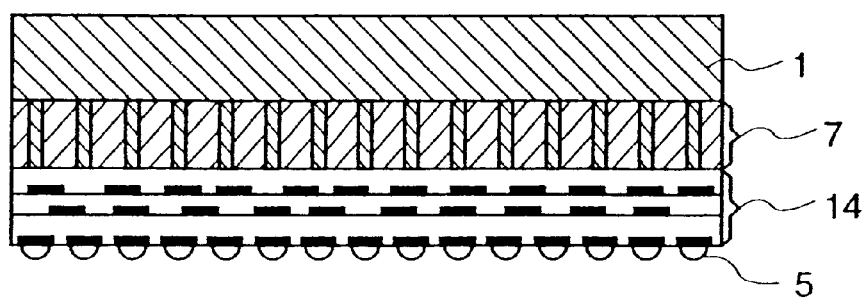
FIG. 6 is a typical sectional view of a semiconductor device according to a third example.

FIG. 6 is a typical sectional view of a semiconductor device according to one example of the present invention, wherein multiple wiring layers 14 are connected to a circuit formation surface of a silicon semiconductor chip 1 via a multi-sword shaped conductor containing buffer layer 7.

A both side copper-clad laminate (MCLE67, produced by Hitachi Chemical Co., Ltd.) was patterned by etching, and was coated with a permanent resist (Provia 52, produced by Ciba-Geigy Japan Limited), followed by drying, exposure, and development to form photo-via holes, and then the permanent resist was hardened by heating.

Next, the laminate was pieced by drilling to form through-holes, followed by nonelectrolytic copper plating to form a copper layer thereon, and then the copper layer was patterned by etching, to thereby form multiple wiring layers 14. Solder balls 5 were connected in a grid array onto the packaging surface of the multiple wiring layers 14, and a buffer film (ASMAT, produced by NITTO DENKO CORPORATION) as a multi-sword shaped conductor containing buffer layer 7 was laminated and bonded onto the opposed surface of the multiple wiring layers 14, to thereby obtain a semiconductor device. The semiconductor device was evaluated in terms of temperature cycle testing, lead inductance, switching noise, and crosstalk. The results are shown in Table 1.

EXAMPLE 4

Figure 7:
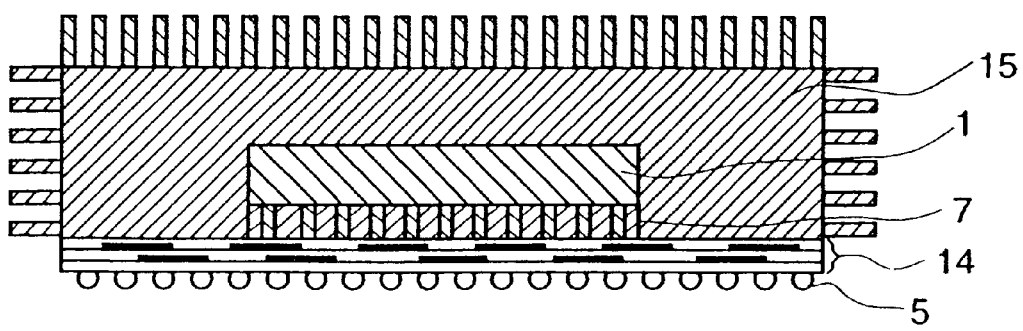
FIG. 7 is a typical sectional view of a semiconductor device according to a fourth example.

FIG. 7 is a typical sectional view of a semiconductor device according to one example of the present invention. A semiconductor chip 1 was buried in a copper made heat spreader 15 having heat radiation fins and fixed thereto by means of a silicon base adhesive, with the circuit formation surface of the semiconductor chip 1 directed on the packaging side, and a buffer film (ASMAT, produced by NITTO DENKO CORPORATION) as a multi-sword shaped conductor containing buffer layer 7 was similarly buried in the heat spreader 15 and bonded with the circuit formation surface of the semiconductor chip 1. Multiple wiring layers 15 were formed on the packaging surface of the heat spreader 15 in the following manner.

First, there were prepared two pieces of both side copper-clad laminates (MCF5000I, produced by Hitachi Chemical Co., Ltd.), in each of which wiring patterns were each formed on both surfaces thereof by a specified etching process. These laminates were adhesively bonded with each other by means of an adhesive (AS2250, produced by Hitachi Chemical Co., Ltd.), and were pieced by laser to form through-holes, followed by electric connection of these laminates by nonelectrolytic plating via the though-holes, to thereby obtain the multi-layered wiring substrate 14.

Solder balls 5 were connected in a grid array onto the packaging surface of the multi-layered wiring substrate 14, to thereby obtain a semiconductor device. The semiconductor device thus obtained was evaluated in terms of temperature cycle testing, lead inductance, switching noise, and crosstalk. The results are shown in Table 1.

EXAMPLE 5

Figure 8:
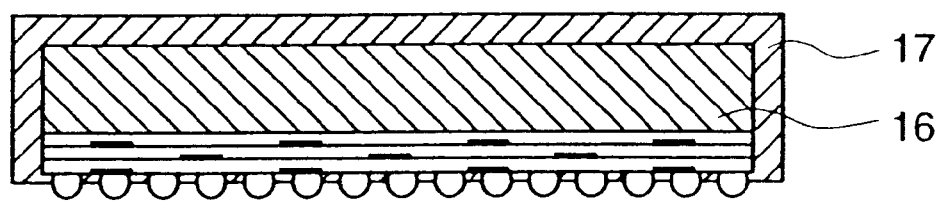
FIG. 8 is a typical sectional view of a semiconductor device according to a fifth example.

The semiconductor device 16 fabricated in the same manner as that in Example 1 was sealed by a transfer molding process using an epoxy resin base mold resin (RM192, produced by Hitachi Chemical Co., Ltd.) as shown in FIG. 8, to obtain a semiconductor device in this example. In addition, the transfer molding condition was as follows:
mold temperature: 180° C.
molding pressure: 7 MPa
transfer time: 15 sec
molding time: 90 sec

EXAMPLE 6

Figure 9:
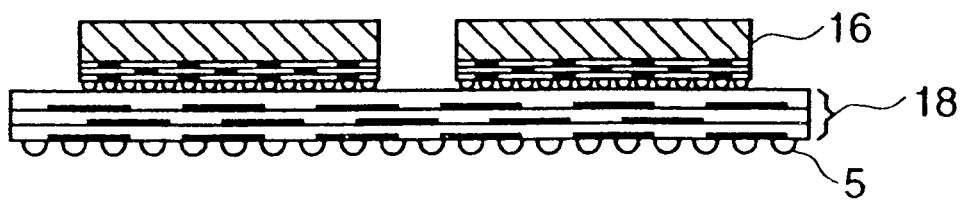
FIG. 9 is a typical sectional view of a semiconductor device according to a sixth example.

As shown in FIG. 9, two pieces of the semiconductor device 16 fabricated in the same manner as that in Example 1 were electrically connected and mounted on a multi-layered wiring substrate 18 formed in the same manner as that in Example 3, to obtain a multi-chip packaging structure in which solder balls 5 were formed in a grid array on the packaging surface of the multi-layered wiring substrate 18.

COMPARATIVE EXAMPLE 1

A conventional BGA (Ball Grid Array) type semiconductor device (number of pins: 225, size: 27 mm×27 mm) was evaluated in terms of temperature cycle testing, lead inductance, switching noise, and crosstalk. The results are shown in Table 1.

COMPARATIVE EXAMPLE 2

A conventional QFP (Quad Flat Package) type semiconductor device (number of pins: 208, size: 31 mm×31 mm) was evaluated in terms of temperature cycle testing, lead inductance, switching noise, and crosstalk. The results are shown in Table 1.

When compared with the conventional semiconductor devices, the semiconductor device of the present invention shown in each example does not produce any connection failure in the temperature cycle testing, and is low in inductance, switching noise, and crosstalk per unit length.

TABLE 1

| | | Example | | | | Comparative Example | |
|---|---|---|---|---|---|---|---|
| | | 1 | 2 | 3 | 4 | 1 | 2 |
| number of terminals per unit area (piece/cm$^2$) | | 51 | 51 | 51 | 55 | 31 | 22 |
| temperature cycle testing* | 1000 cycle | 0/50 | 0/50 | 0/50 | 0/50 | 1/50 | 2/50 |
| | 3000 cycle | 0/50 | 0/50 | 0/50 | 1/50 | 20/50 | 10/50 |
| lead inductance per unit length (nH/mm) | | 0.25 | 0.28 | 0.28 | 0.30 | 0.49 | 0.63 |
| switching noise (V) | | 0.30 | 0.35 | 0.35 | 0.40 | 0.55 | 0.73 |
| crosstalk (V) | | 0.04 | 0.05 | 0.05 | 0.07 | 0.09 | 0.51 |

*number of failures/repeated number of testing

What is claimed is:

1. A method of fabricating a semiconductor device, comprising the steps of:
    providing a semiconductor chip;
    forming a multi-layer wiring structure, having at least one wiring layer, overlying the semiconductor chip, wherein the multi-layer wiring structure includes at least one buffer layer for relieving thermal stress produced between said semiconductor chip and a wiring substrate therefor in packaging the semiconductor chip on the wiring substrate, the at least one wiring layer being positioned so as to be in electrical connection with the semiconductor chip; and
    forming ball-like terminals, which are for electrical connection to the wiring substrate, on a surface of the multi-layer wiring structure that is not closest to the semiconductor chip.

2. The method according to claim 1, wherein the multi-layer wiring structure is formed such that a first side thereof is closest to a first surface of the semiconductor chip, and wherein the ball-like terminals are provided on a side of the multi-layer wiring structure opposite to said first side thereof.

3. The method according to claim 1, wherein said at least one buffer layer has a modulus of elasticity of at most 10 Kg/mm$^2$.

4. The method according to claim 1, wherein the multi-layer wiring structure is formed by forming an insulating layer overlying the semiconductor chip, said insulating layer having holes therethrough exposing the semiconductor chip; forming a wiring layer overlying the insulating layer, the wiring layer being in electrical connection with the semiconductor chip; and forming the ball-like terminals in electrical connection with the wiring layer, said insulating layer being the buffer layer for relieving thermal stress.

5. The method according to claim 4, wherein said insulating layer is made of an elastomer.

6. The method according to claim 4, wherein the insulating layer has a modulus of elasticity of at most 10 Kg/mm$^2$.

7. The method according to claim 4, wherein the step of forming the insulating layer includes forming a film of material of the insulating layer and selectively removing the film to form the holes exposing the semiconductor chip.

8. The method according to claim 4, wherein the forming of the multi-layer wiring structure includes further steps of alternately forming further insulating layers and further wiring layers, the further insulating layers having holes therethrough such that layers, of the wiring layer and further wiring layers, can be provided in electrical connection with each other.

9. The method according to claim 8, wherein the ball-like terminals are formed on a wiring layer, of the wiring layer and further wiring layers, furthest from the semiconductor chip.

10. The method according to claim 8, wherein each insulating layer and further insulating layer is made of an elastomer, and constitutes a buffer layer for relieving thermal stress produced between the semiconductor chip and the wiring substrate therefor in packaging the semiconductor chip on the wiring substrate.

11. The method according to claim 1, wherein the multi-layer wiring structure is formed by providing a multi-layered wiring sheet; providing a multi-wire, conductor-containing buffer layer, the multi-wire, conductor-containing buffer layer being said at least one buffer layer for relieving thermal stress; and attaching the multi-layered wiring sheet to the semiconductor chip via the multi-wire, conductor-containing buffer layer.

12. The method according to claim 11, wherein the ball-like terminals are formed on the multi-layered wiring sheet.

13. The method according to claim 11, wherein the multi-layered wiring sheet is formed by adhering a plurality of sheets of wiring to each other, forming windows for inter-layer connection in the plurality of sheets, and performing inter-layer connection.

14. The method according to claim 11, wherein the multi-wire, conductor-containing buffer layer is an anisotropic conductive film which has electrical conductivity only in a thickness direction of the buffer layer.

15. The method according to claim 11, wherein the multi-wire, conductor-containing buffer layer is a film having through-holes, the through-holes being buried with a conductive material; and wherein in attaching the multi-layered wiring sheet to the semiconductor chip via the multi-wire, conductor-containing buffer layer the conductive material buried in the through-holes is in electrical connection with the semiconductor chip.

16. The method according to claim 15, wherein said film having through-holes is made of a polyimide material.

17. The method according to claim 11, wherein the step of providing the multi-wire, conductor-containing buffer layer includes casting an elastomer into a vessel in which conducting wires are erected, thereby forming a cast layer containing the conducting wires which constitutes the buffer layer.

18. The method according to claim 11, wherein the step of attaching adhesively bonds the multi-layered wiring sheet to the semiconductor chip via the multi-wire, conductor-containing buffer layer.

19. The method according to claim 1, comprising the further steps of:

providing the wiring substrate;

positioning the multi-layer wiring structure, having the ball-like terminals formed on a surface thereof, on the wiring substrate, with the ball-like terminals being adjacent the wiring substrate; and electrically connecting the multi-layer wiring structure to the wiring substrate, via the ball-like terminals, thereby forming a packaging substrate.

* * * * *